United States Patent [19]
Sasaki et al.

[11] Patent Number: 5,625,321
[45] Date of Patent: Apr. 29, 1997

[54] VARIABLE GAIN AMPLIFIER APPARATUS

[75] Inventors: Kazuji Sasaki; Masayuki Katakura, both of Kanagawa; Kazuyuki Saijo, Tokyo, all of Japan

[73] Assignee: Sony Corporation, Tokyo, Japan

[21] Appl. No.: 547,120

[22] Filed: Oct. 23, 1995

[30] Foreign Application Priority Data

Oct. 28, 1994 [JP] Japan .................................. 6-289140

[51] Int. Cl.$^6$ ................................ H03F 3/68; H03G 3/20
[52] U.S. Cl. .................................... 330/124 R; 330/129
[58] Field of Search ........................ 330/124 R, 129, 330/278, 295; 455/234.1, 250.1, 253.2

[56] References Cited

U.S. PATENT DOCUMENTS

| | | | |
|---|---|---|---|
| 3,728,633 | 4/1973 | Krebs | 330/124 R X |
| 3,748,588 | 7/1973 | Beurrier | 330/124 R X |
| 3,868,584 | 2/1975 | Beurrier | 330/124 R |

*Primary Examiner*—Steven Mottola
*Attorney, Agent, or Firm*—Jay H. Maioli

[57] ABSTRACT

In a variable gain amplifier apparatus, wide input dynamic range can be secured and low noise characteristic can be obtained by employing first and second variable gain amplifiers have different noise characteristics and different saturation input levels and receive a same input signal. Output signals of the first and second variable gain amplifiers are added to each other to provide an output signal of the variable gain amplifier apparatus. Desired noise characteristic and saturation input level characteristic of the variable gain amplifier apparatus can be obtained by selecting the noise characteristics and the saturation input levels of the first and second variable gain amplifiers appropriately. This allows the variable gain amplifier apparatus to have a wide input dynamic range and low noise characteristic.

4 Claims, 4 Drawing Sheets

VARIABLE GAIN AMPLIFIER APPARATUS

BACKGROUND OF THE INVENTION

1. Field of the Invention

The present invention relates to a variable gain amplifier, and, more specifically, relates to a variable gain amplifier which can be used as the AGC circuit of the signal receiving unit in the CDMA (code division multiple access) system digital cellular telephone, for example.

2. Description of the Related Art

Heretofore, a variable gain amplifier has been widely used as an AGC circuit (automatic gain control) to control gains in order to obtain a fixed output signal level for a fluctuating modulated input signal level. The reliability of demodulation is increased by applying a fixed signal level to the demodulator at the later stage of processing, and high signal-to-noise ratio (S/N ratio), i.e. small signal distortion, also increases the reliability of demodulation.

More particularly, when an input signal level to the variable gain amplifier is small, an AGC circuit having low noise characteristics is required to obtain the high signal-to-noise ratio described above. When the input signal level is large, a variable gain amplifier with a high saturation input level is required so that the output signal is not distorted.

In general, in order to expand the dynamic range of an amplifier from the noise level generated in the amplifier to the saturation input level at which the output signal is distorted, a low noise transistor is used to obtain the low noise characteristic and an amplifier having a negative feedback structure is used to increase the saturation input level.

However, in the case where a negative feedback structure is applied to the amplifier in order to expand the dynamic range, the saturation input level is improved, but the noise characteristic of the amplifier becomes worse. As a result, even if a low noise transistor is used, the low noise characteristic is not compatible with the, increase in saturation input level.

SUMMARY OF THE INVENTION

In view of the foregoing, it is an object of the present invention to provide a variable gain amplifier apparatus having a wide input dynamic range and a low noise characteristic.

The foregoing object and other objects of the present invention have been achieved by a provision of the variable gain amplifier apparatus according to the present invention, in which first and the second variable gain amplifiers having different noise characteristics and different saturation input levels receive a common input signal, and the input signal is amplified at the first and the second variable gain amplifiers, and output signals of the first and the second variable gain amplifiers are added to each other to produce an output signal of the variable gain amplifier apparatus.

The first and the second variable gain amplifiers having different noise characteristics and different saturation input levels receive the same input signal, so that noise characteristics and saturation input level characteristics can be obtained corresponding to the level of the input signal, so that wide input dynamic range can be secured and low noise characteristic can be realized.

The nature, principle and utility of the present invention will become more apparent from the following detailed description when read in conjunction with the accompanying drawings in which like parts are designated by like reference numerals or characters.

DETAILED DESCRIPTION OF THE EMBODIMENT

Preferred embodiments of the present invention will be described with reference to the accompanying drawings.

Figure 2:
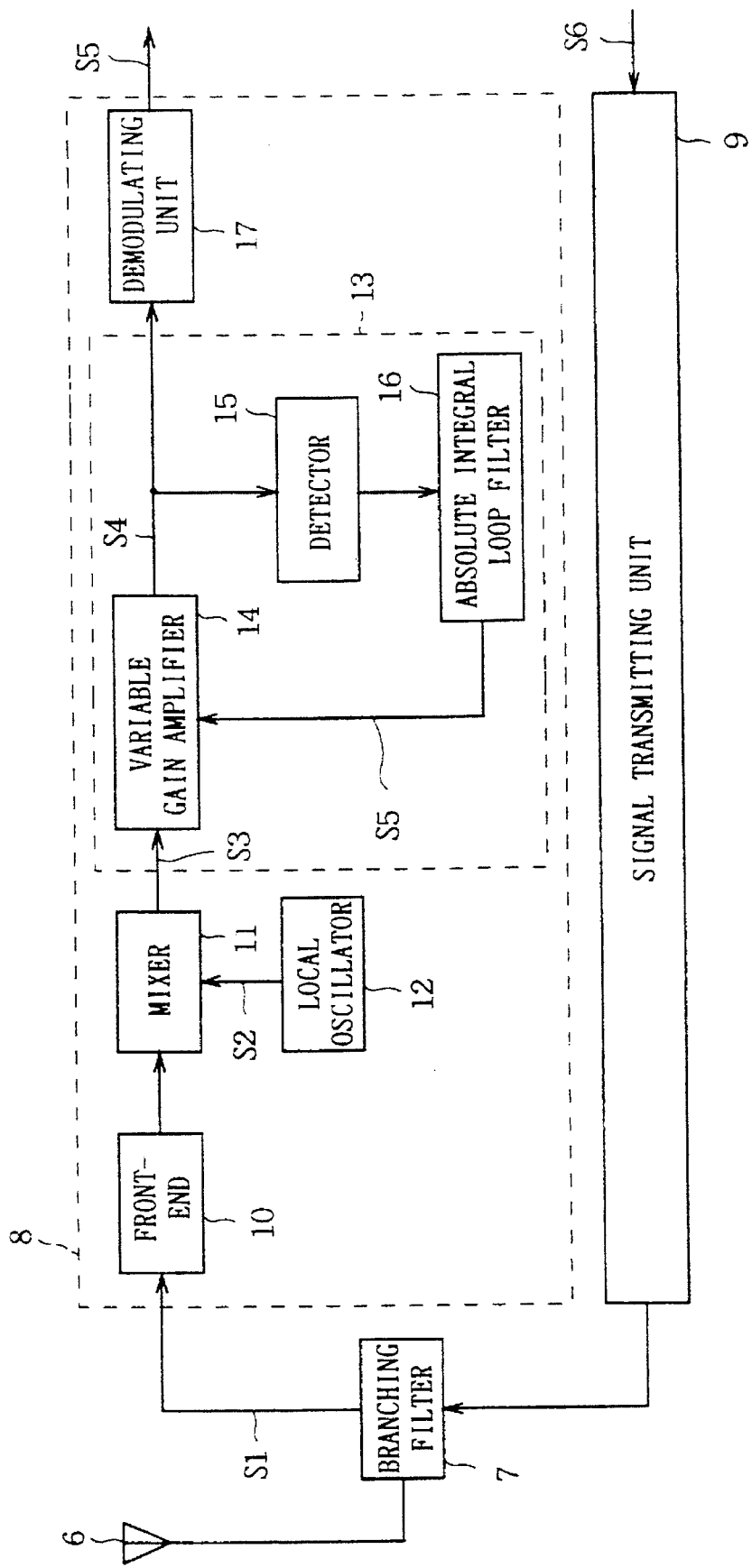
FIG. 2 is a block diagram showing a CDMA system digital cellular telephone mobile station terminal device using the variable gain amplifier of FIG. 1.

FIG. 2 shows the construction of a CDMA system digital cellular telephone mobile station terminal device mainly consisting of a high frequency signal receiving system. Received signal S1, received by an antenna 6, is inputted to a mixer 11 via a branching filter 7 and a front-end 10 of the signal received unit 8. The receiving signal S1 is frequency converted upon being mixed with a signal S2 from a local oscillator 12 at a mixer 11 and is inputted as intermediate frequency (IF) signal S3 to the AGC unit 13 at the next stage.

The AGC unit 13 includes a variable gain amplifier 14, a detector 15, and an absolute integral loop filter 16. IF signal S3 from the mixer 11 is inputted to the variable gain amplifier 14 which provides an amplified output signal S4. The output signal S4 is inputted to the detector 15 for detecting the level of the input signal. The loop filter 16 receives the output signal of the detector 15 and supplies the gain control signal S5 as a feedback signal to the gain control input terminal of the variable gain amplifier 14. The gain of the variable gain amplifier 14 is controlled based on the gain control signal S5, so that output signal S4 output by output level of the variable gain amplifier 14 S4 kept constant. The output signal S4 of the variable gain amplifier 14 is also inputted to a demodulating unit 17 as the output signal of the AGC unit 13. The demodulating unit 17 demodulates the output signal S4 to output audio data S5. On the other hand, in the signal transmitting unit, audio data S6 is inputted to the signal transmitting unit 9. In the signal transmitting unit 9, processes such as modulation, frequency conversion, signal transmitting power amplification and so forth, are performed. The output signal of the signal transmitting unit 9 is sent to the antenna 6 via the branching filter 7 and a signal corresponding to the output signal of the signal transmitting unit 9 is outputted from the antenna 6.

Figure 1:
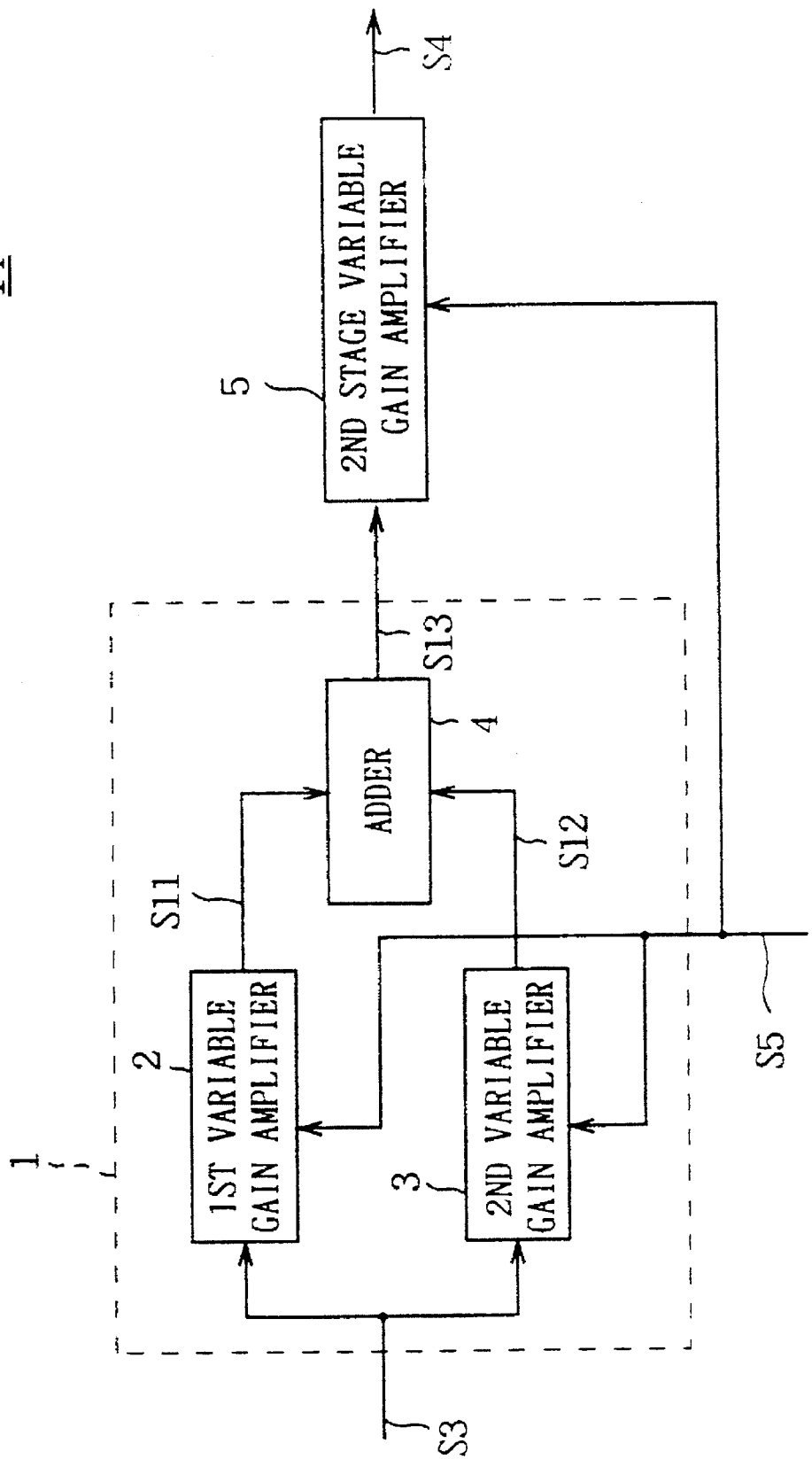
FIG. 1 is a block diagram showing the construction of an embodiment of the variable gain amplifier apparatus according to the present invention.

The variable gain amplifier 14 consists of one stage or plural stages of the variable gain amplifier apparatus 1 according to the present invention. FIG. 1 shows the variable gain amplifier apparatus 14 consisting of two stages of variable gain amplifiers 1, according to the present invention. In this figure, the primary stage variable gain amplifier apparatus 1 of the variable gain amplifier apparatus 14 has first and second variable gain amplifiers 2, and 3 receiving a common input signal S3. Common input IF signal S3 is amplified at the first variable gain amplifier 2 and the second variable gain amplifier 3. Output signals S11 and S12 of amplifiers 2 and 3, respectively, are added to each other, by an adder. The output of adder 4 is then inputted to the variable gain amplifier 5 of the second stage as output signal S13. The gain control signal S5 from the loop filter 16 is inputted to the gain control input terminal of the first variable gain amplifier 2, the second variable gain amplifier 3, and the variable gain amplifier 5 of the second stage respectively.

Figure 3A:
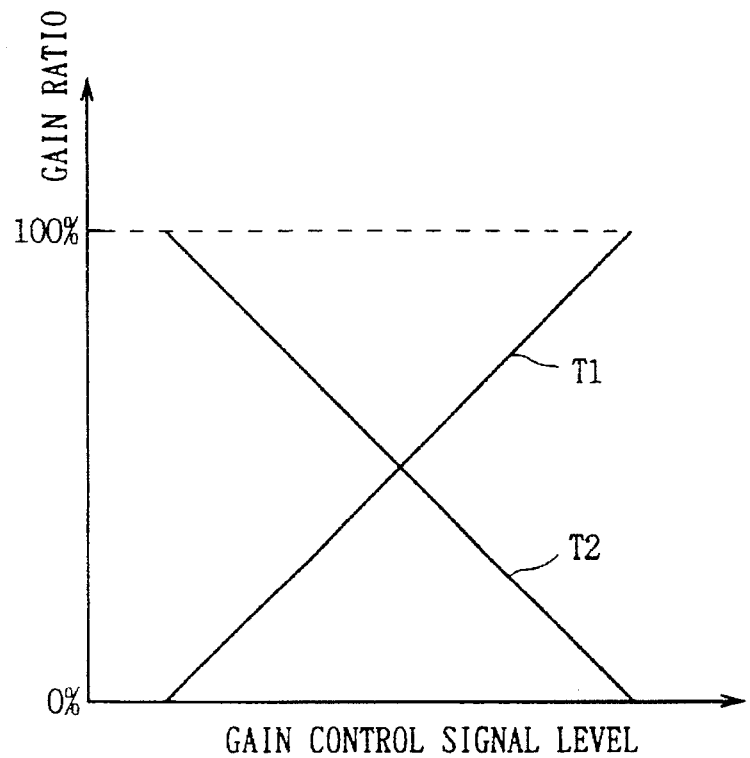
FIGS. 3A and 3B are characteristic curvilinear diagrams explaining gain characteristics of the first and the second variable gain amplifiers.
Figure 3B:
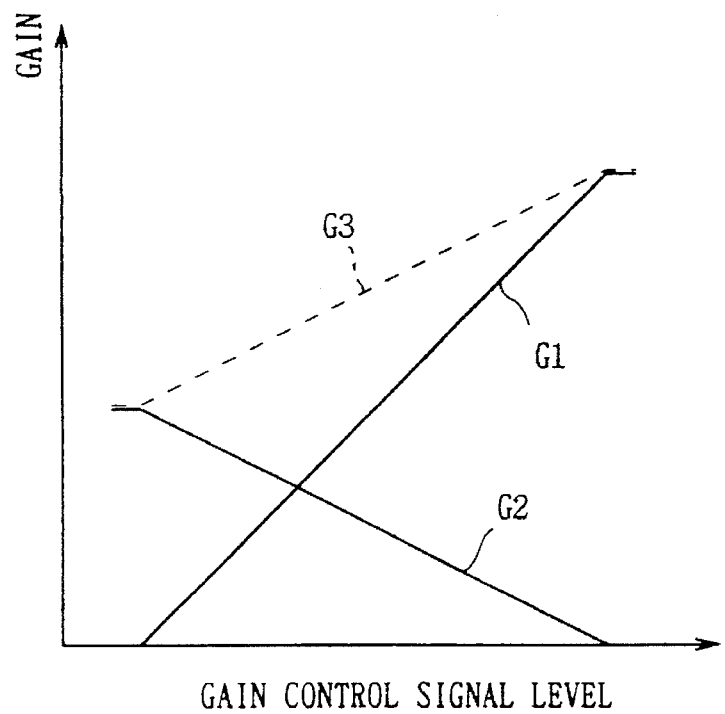

FIG. 3A shows gain ratios T1 and T2, to the gain control signal level, wherein the maximum gains of the first variable gain amplifier 2 and the second variable gain amplifier 3 are represented by 100%. As shown in FIG. 3A the gain ratios T1 and T2 are selected so as to have a complementary relation. FIG. 3B shows gain G1 of the first variable gain amplifier 2, gain G2 of the second variable gain amplifier 3, and combined gain G3 which is obtained by combining gains G1 and G2. As shown in FIG. 3B, the gain control signal level vs. gain characteristic required for the variable gain amplifier 1 can be obtained by selecting the gain control sensitivity and the maximum gain value of the first and second variable gain amplifiers 2 and 3 appropriately.

Figure 4A:
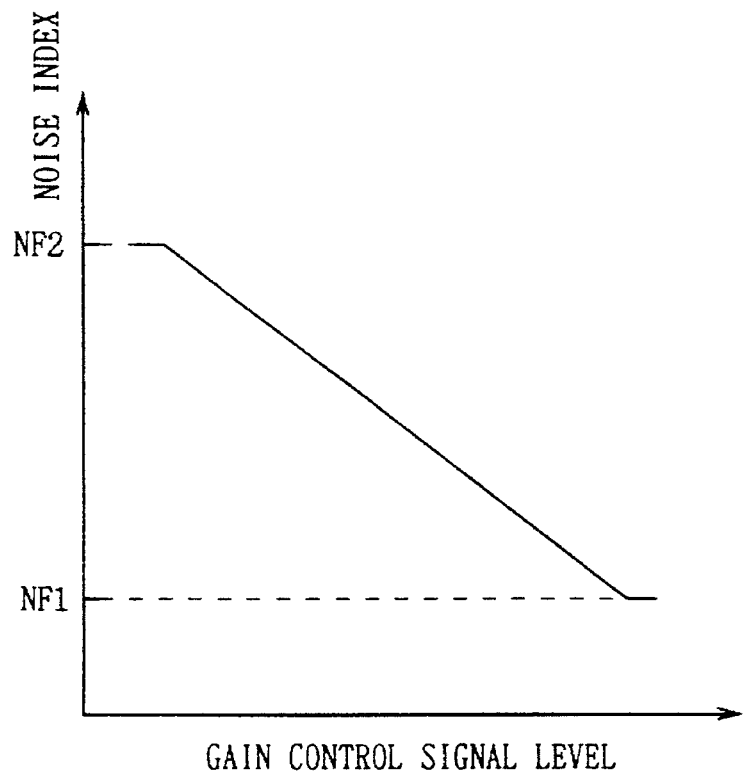
FIGS. 4A and 4B are characteristic curvilinear diagrams explaining the noise function and IP3 to be required for the first stage variable gain amplifier apparatus.
Figure 4B:
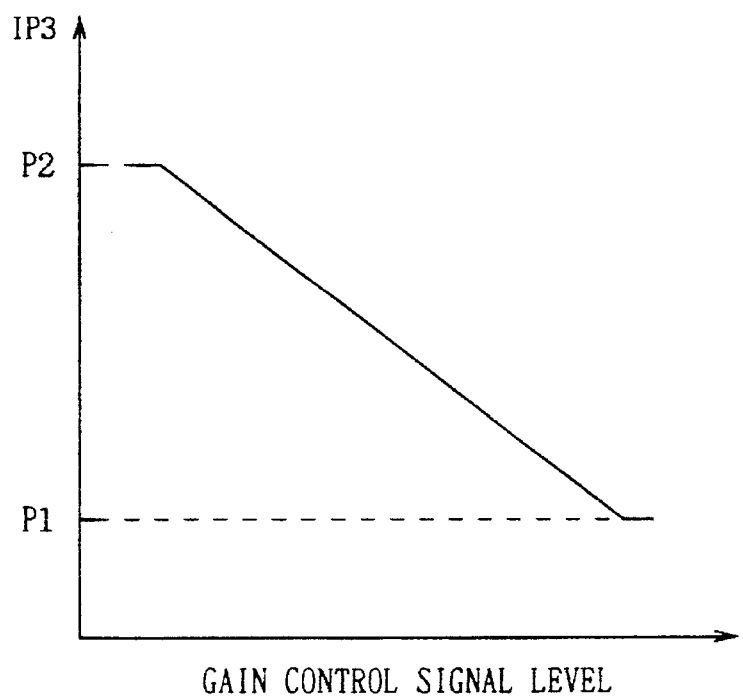

For the efficiency of a communication device, the noise characteristic is evaluated using the noise index (ratio of S/R ratio in input to S/R ratio in IF output). The saturation input level is evaluated using the intercept point (hereinafter, called IP3) (intercept point of the virtual extended line of input and output characteristics of based wave and the virtual extended line of three-dimensional inter-modulated distortion input and output characteristics). FIG. 4A shows the noise indices to the gain control signal level of the primary stage gain amplifier and FIG. 4B shows IP3's to the gain control signal level of the variable gain amplifier of the primary stage amplifier 1, and this indicates that desired noise index and the saturation input level can be designed independently. Here, NF1 is the noise index of the first variable gain amplifier 2 and P1 is IP3 of the first variable gain amplifier 2. NF2 is the noise index of the second variable gain amplifier 3 and P2 is IP3 of the second variable gain amplifier 3.

According to the foregoing construction, in the case where the first variable gain amplifier 2 having low noise characteristic and the second variable gain amplifier 3 having high saturation input level are selected, when low noise characteristic is required, the output ratio of the first variable gain amplifier 2 is increased. When a high saturation input level characteristic is required, the output ratio of the second variable gain amplifier 3 is increased by gain control signal S5 in accordance with the intensity of the signal level of input signal S3. The gain of the variable gain amplifier apparatus 1 is weightened by respective gains of the first and second variable gain amplifiers and combined. Thereby, the primary stage variable gain amplifier 1 which is capable of having both low noise characteristic and high saturation input level can be realized. In the case of using the variable gain amplifier 1 according to the present invention in the AGC unit 13 of the signal receiving unit 8, an excellent S/N ratio can be obtained even if the input signal is weak and the input signal would not be distorted by saturation if the input signal is strong. According,the reliability of modulation can be secured.

Note that, in the embodiment described above, the first and second variable gain amplifiers 2 and 3 are utilized. However, even if the general amplifier is used in place of one the variable gain amplifiers, i.e., making the gain control sensitivity of the variable gain amplifier to be zero and the other amplifier is used as a variable gain amplifier changing its gain ratio, the same effect as those of the embodiment described above can be realized. Furthermore, if the first variable gain amplifier and the second variable gain amplifier have decreasing characteristics, effects similar to those of the embodiment described above can be obtained.

Moreover, in the embodiments described above, the present invention is applied to the primary stage of the signal receiving AGC unit of the CDMA system digital cellular telephone mobile station terminal device. However, the present invention is not only limited to the above but also is suitably applied to the circuit which controls gains while keeping the low noise characteristic and securing wide dynamic range at the same time.

According to the present invention as described above, since the first and second variable gain amplifiers having different noise characteristics and saturation input levels respectively are arranged in parallel and the same input signal is applied to them, the noise characteristics and saturation input level characteristics corresponding to the level of the input signal can be obtained and thereby a variable gain amplifier capable of securing the wide input dynamic range and low noise characteristic can be realized.

While the above has been described in connection with the preferred embodiments ore the invention, it will be obvious to those skilled in the art that various changes and modifications may be made thereto, without departing from the spirit and scope of the present invention. The appended claims are intended to cover all such changes and modifications as may fall within the true spirit and scope of the present invention.

What is claimed is:

1. A variable gain amplifier apparatus comprising:

first and second variable gain amplifiers having different noise characteristics and different saturation input levels, said first and second variable gain amplifiers receiving a common input signal, and the gains of said first and second variable gain amplifiers being controlled by a common gain control signal; and an adding circuit for adding an output signal of the first variable gain amplifier and an output signal of the second variable gain amplifier to each other, wherein the gains of said first and second variable gain amplifiers change in a complementary manner in response to said common gain control signal.

2. The variable gain amplifier apparatus according to claim 1, wherein maximum gain values of said first and second variable gain amplifiers are different from each other.

3. The variable gain amplifier apparatus according to claim 2, wherein said first variable gain amplifier has a gain that changes in proportion to a level of said gain control signal and has a low noise characteristic, and said second variable gain amplifier has a gain that changes in inverse proportion to the level of said gain control signal and has a high saturation input level.

4. The variable gain amplifier apparatus according to claim 1, wherein said first variable gain amplifier has a gain that changes in proportion to a level of said gain control signal and has a low noise characteristic, said second variable gain amplifier has a gain that changes in inverse proportion to the level of said gain control signal and has a high saturation input level, and a maximum gain value of said first variable gain amplifier is larger than a maximum gain value of said second variable gain amplifier.

\* \* \* \* \*